United States Patent [19]

van Alem et al.

[11] 4,351,051
[45] Sep. 21, 1982

[54] SEMICONDUCTOR LASER DEVICE WITH AN ASSEMBLY BLOCK

[75] Inventors: Antonius A. M. van Alem; Johan C. J. Finck, both of Eindhoven; Peter W. M. van de Water, Nijmegen, all of Netherlands

[73] Assignee: U.S. Philips Corporation, New York, N.Y.

[21] Appl. No.: 164,200

[22] Filed: Jun. 30, 1980

[30] Foreign Application Priority Data

Jun. 26, 1979 [NL] Netherlands .......................... 7904954

[51] Int. Cl.³ .............................................. H01S 3/19
[52] U.S. Cl. ...................................... 372/36; 357/19; 357/74; 357/81
[58] Field of Search ...................... 331/94.5 H, 94.5 S; 357/74, 81, 17–19; 174/52 S; 372/36

[56] References Cited

U.S. PATENT DOCUMENTS

| 3,857,993 | 12/1974 | Gregory | 174/52 S |
| 4,240,090 | 12/1980 | Hughes et al. | 357/74 X |
| 4,270,134 | 5/1981 | Takeda et al. | 331/94.5 H X |

FOREIGN PATENT DOCUMENTS

| 2403566 | 8/1974 | Fed. Rep. of Germany | 331/94.5 |
| 2604788 | 8/1976 | Fed. Rep. of Germany | 331/94.5 |
| 54-101296 | 8/1979 | Japan | 331/94.5 H |

*Primary Examiner*—James W. Davie
*Attorney, Agent, or Firm*—Thomas A. Briody; Robert T. Mayer; Steven R. Biren

[57] ABSTRACT

A semiconductor laser device includes a support having a substantially annular assembly block of a metal having a good thermal conductivity, which assembly block includes positioning means on its outer circumference for accurately locating the optical axis of said laser element and a sector-shaped supporting part which extends towards the center line of the block and which has a connection and mounting face for a laser element extending through the center line and accurately located with respect to the positioning means. A base includes mutually-insulated electrical conductors and a photodiode which is secured on the side of the assembly block remote from the supporting part, and a cap having a light-transmitting window is secured to the assembly block so as to form a hermetic envelope.

5 Claims, 3 Drawing Figures

SEMICONDUCTOR LASER DEVICE WITH AN ASSEMBLY BLOCK

BACKGROUND OF THE INVENTION

The invention relates to a semiconductor laser device comprising a support, a semiconductor laser element mounted on the support, and a cap which is provided with a light-transmitting window and is secured to the support.

In the near future, semiconductor laser devices will find wide application. Important fields of application are optical communication and optical scanning of record carriers which are provided with optically readable information structures, both for video and for audio applications. In the first instance the device according to the invention is suitable for use in the optical scanning of record carriers.

A number of requirements are imposed upon semiconductor laser devices. For durability good cooling of the laser element is necessary. It is also desirable to accommodate the laser element in a hermetic envelope. The envelope should preferably consist of inexpensive components which are easy to assemble. The location of the optical axis of the laser element, however, must be unambiguously fixed.

SUMMARY OF THE INVENTION

It is the object of the invention to provide a semiconductor laser device which satisfies the above requirements. For this purpose, the semiconductor laser device is characterized in that the support consists of a substantially annular assembly block formed of a metal having a good thermal conductivity, which assembly block comprises positioning means on its outer circumference and furthermore comprises a sector-shaped supporting part which extends towards its center line and which has a connection face for the laser element extending through the center line and accurately determined with respect to the positioning means, a base having mutually insulated electrical conductors and a photodiode being connected on the side of the assembly block remote from the supporting part, the cap having the light-transmitting window being connected on the other side of the assembly block.

The assembly block has a multiple function. It serves as a support for the laser element and is manufactured from a readily heat-conducting material, so that a rapid dissipation of the thermal energy generated by the laser is ensured. The location of the optical axis of the laser is accurately positioned with respect to the positioning means. Correct adjustment in a holder, for example, when used for optical scanning of record carriers, can therefore be done without any problems. The assembly block furthermore makes it possible to obtain a hermetically sealed envelope which can easily be assembled while using a base and cap which are simple and cheap to manufacture. Since the place of the optical axis of the laser element is determined by the assembly block, no requirements need be imposed upon the accuracy of the base and cap.

The outer circumference of the assembly block is preferably circular with a diameter exceeding the dimensions of the base and the cap. The circular outer circumference may then serve as a reference rim or adjustment rim.

According to an embodiment of the invention, the base may comprise a glass-filled metal cap in which a number of conductors are accommodated in an insulated manner, which cap may have a flange which is secured to the assembly block.

The assembly block permits using a base which corresponds substantially to a base of conventional outline for a hermetically enveloped transistor.

The device is preferably characterized in that the photodiode is connected on the upper surface of the metal cap of the base, the connection face for the photodiode making an angle of 8°–10° with the upper surface.

The photodiode serves to control the laser element. Due to the inclined arrangement of the photodiode light radiated from the laser element to the diode is prevented from being reflected back to the laser element and adversely influencing the adjustment of the device.

The cap comprising the light-transmitting window may be provided with a glass plate which is secured to the cap by means of an interposed metal ring by means of a thermocompression bond.

BRIEF DESCRIPTION OF THE DRAWINGS

The invention will be described in greater detail with reference to the drawing. In the drawing.

DETAILED DESCRIPTION OF THE DRAWINGS

Figure 1:
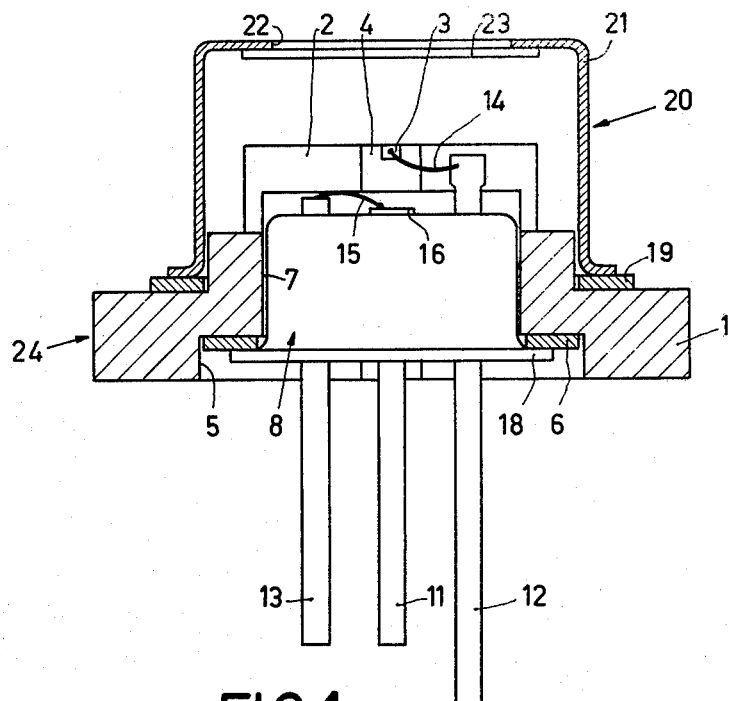
FIG. 1 is a sectional view of a preferred embodiment of the device according to the invention.
Figure 2:
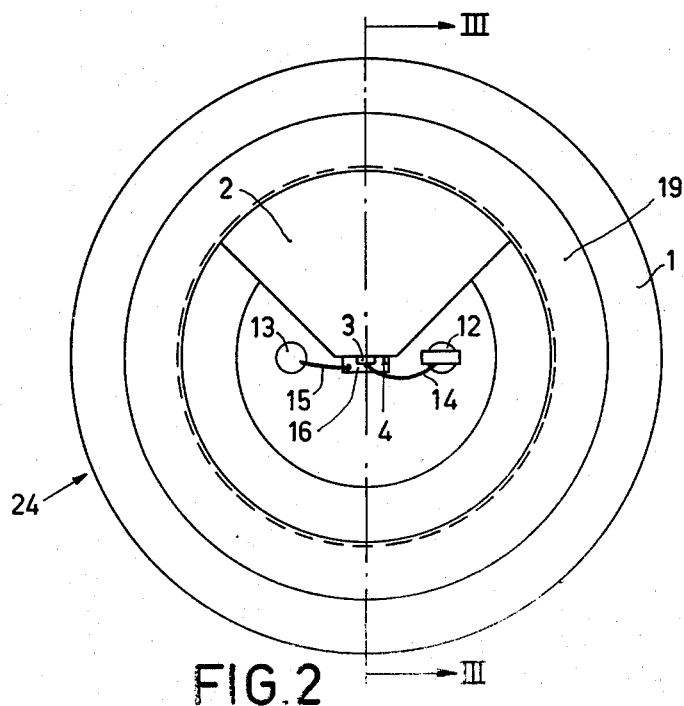
FIG. 2 is a plan view of this device without a cap.
Figure 3:
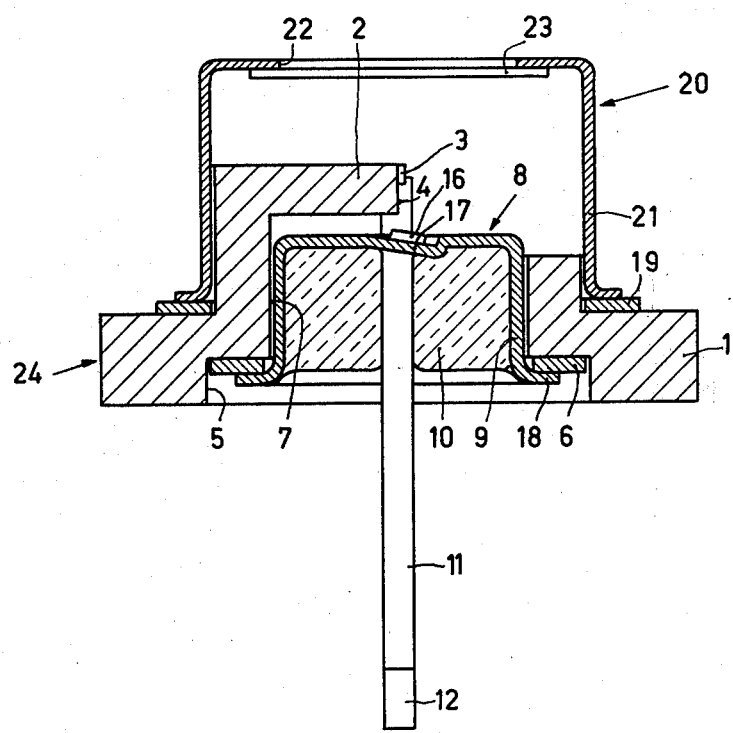
FIG. 3 is a sectional view taken on the line III—III of FIG. 2.

FIGS. 1–3 show a preferred embodiment of the laser device according to the invention. The device comprises an assembly block 1 which preferably consists of copper. The assembly block is substantially annular. On its upper side it has a sector-shaped supporting part 2 for a semiconductor laser element 3. The laser element 3 is provided, with one of its contacts, on the connection pad 4. The connection pad 4 extends up to the center line of the assembly block 1.

In the preferred embodiment shown, a recess 5 is provided on the lower side of the assembly block 1. A welding ring 6 is provided in said recess. The welding ring 6 may consist of nickel-plated steel and is secured to the assembly block by means of a hardsolder. A base 8 is provided in the central cavity 7 of the assembly block. The base 8 may be a modified version of the base of a standardized transistor envelope, for example, having a TO 18 outline. The base comprises a cap 9 of an iron-nickel-cobalt alloy, which cap is filled with glass 10. A number of mutually insulated conductors are accommodated in the base 8. In the embodiment shown three conductors 11, 12 and 13 are shown; if necessary, this number may be chosen to be larger. Flange 18 of base 8 is secured to welding ring 6 by means of resistance welding.

Conductor 11 is connected to cap 9 and can thus form a ground contact. The conductors 12 and 13 are passed through the cap 9 in an insulated manner. The end of conductor 12 is electrically connected to one of the contacts of laser element 3 by means of a wire 14. A photodiode 16 is provided on the base 8. One of the contacts of photodiode 16 is connected electrically to the cap 9 and thus to the conductor 11. The other contact is connected to conductor 13 by means of a wire 15. The photodiode 16 is arranged so that light from laser element 3 will impinge on the diode 16. In order to prevent light from being reflected back into the laser element, the location 17 of the photodiode makes an angle of 8° to 10° with the upper surface of base 8.

A further welding ring 19 is soldered to the assembly block. A cap 20 is welded to said welding ring so that the laser element 3 and the photodiode 16 are hermetically enveloped. The cap 20 comprises a spherical portion 21, for example of nickel-iron, in which an aperture 22 is present. The aperture 22 is closed by means of a glass plate 23. A comparatively thin glass plate has been chosen, for example a microscope glass of 0.17 mm. With such a thin glass plate no special requirement need be imposed upon the plane-parallelism, parallax does not occur and the connection causes no optical changes. The connection between the glass plate 23 and the spherical portion 21 is preferably obtained by interposing a ring of a metal, after which the parts are pressed against each other at elevated temperature. A ring of aluminium has proved to be particularly suitable. A hermetic thermocompression bond is obtained at a temperature of approximately 400° C. A further suitable metal is indium; the thermocompression bond is then realized at a temperature of approximately 120° C. The glass plate is transparent to the light emitted by the laser element 3. It is also possible to connect the glass plate with a suitable adhesive.

The assembly block 1 forms an important element of the hermetic envelope shown. The outermost circumferential part 24 is processed very accurately and the position of the connection pad 4 for the laser element is fixed very accurately with respect to the outermost circumferential part 24. The outermost circumferential part 24 then forms the reference rim or adjustment rim for the device. If desired, the assembly block may also be provided with other positioning means. The place of the optical axis of the laser element is accurately fixed with respect to the reference rim. The accuracy of the rest of the assembly block and the accuracy of both the base and the cap does not play a role in accurately positioning the laser, so that these elements may be of inexpensive construction. The assembly block ensures very good heat dissipation, which is of importance for the life of the laser element.

What is claimed is:

1. A semiconductor laser device comprising a support, a semiconductor laser element mounted on the support, and a cap over said laser element which is provided with a light-transmitting window and is secured to the support, the support comprising a substantially annular assembly block of a metal having a good thermal conductivity, which assembly block comprises positioning means on its outer circumference for accurately locating the optical axis of said laser element and a sector-shaped supporting part which extends towards the axis through the center of the annular assembly block and which forms a connection and mounting area for the laser element which extends through said axis and is accurately located with respect to said positioning means, and a base having a supporting part on its lower side, mutually-insulated electrical conductors and a photodiode mounted on its upper side, said base being secured on the lower side of the assembly block remote from the supporting part, the cap having the light-transmitting window being secured at the upper side of the assembly block and said window being located above said laser element and said photodiode.

2. A semiconductor laser device as claimed in claim 1, wherein the outer circumference of the assembly block is circular and has a diameter exceeding the dimensions of the base and the cap.

3. A semiconductor laser device as claimed in claim 1 or 2 wherein the base comprises a glass-filled metal cap in which a number of conductors are embedded in an insulated manner, said metal cap having a flange which is secured to the assembly block.

4. A semiconductor laser device as claimed in claim 3, wherein the photodiode is mounted on the upper surface of the metal cap of the base, the portion of the upper surface of the metal cap on which the photodiode is mounted making an angle of 8°–10° with the remaining portion of said upper surface.

5. A semiconductor laser device as claimed in claim 1 or 2, wherein the cap comprises a glass window which is secured to the cap by an interposed metal ring using a thermocompression bond.

* * * * *